(12) United States Patent
Nakashima et al.

(10) Patent No.: US 7,723,835 B2
(45) Date of Patent: May 25, 2010

(54) SEMICONDUCTOR DEVICE PACKAGE STRUCTURE

(75) Inventors: Moriyoshi Nakashima, Amagasaki (JP); Kazuo Kobayashi, Amagasaki (JP); Natsuo Ajika, Amagasaki (JP)

(73) Assignee: GENUSION, Inc., Hyogo (JP)

( * ) Notice: Subject to any disclaimer, the term of this patent is extended or adjusted under 35 U.S.C. 154(b) by 70 days.

(21) Appl. No.: 12/235,734

(22) Filed: Sep. 23, 2008

(65) Prior Publication Data
US 2009/0065922 A1 Mar. 12, 2009

Related U.S. Application Data

(63) Continuation of application No. 10/595,424, filed as application No. PCT/JP03/16012 on Dec. 15, 2003, now abandoned.

(30) Foreign Application Priority Data
Oct. 20, 2003 (JP) ............................. 2003-359896

(51) Int. Cl.
*H01L 23/02* (2006.01)
(52) U.S. Cl. ...................... 257/686; 257/777
(58) Field of Classification Search ................ 257/686, 257/777, 723, 724, 701, 787, 790
See application file for complete search history.

(56) References Cited

U.S. PATENT DOCUMENTS 6,242,931 B1 6/2001 Hembree et al.

| | | |
|---|---|---|
| 6,351,028 B1 | 2/2002 | Akram |
| 7,064,006 B2 | 6/2006 | Akram |
| 7,282,793 B2 | 10/2007 | Akram |

(Continued)

FOREIGN PATENT DOCUMENTS

JP 62-134939 6/1987

(Continued)

OTHER PUBLICATIONS

"Lecture on basic microelectronics packaging technology (vol. 1) general statement", p. 26-28, Jul. 1, 1998, Society for Hybrid Microelectronics. (previously submitted English Abstract Sep. 9, 2009).

(Continued)

*Primary Examiner*—S. V Clark
(74) *Attorney, Agent, or Firm*—Renner, Otto, Boisselle & Sklar, LLP

(57) ABSTRACT

A semiconductor chip mounted interposer (60) is configured by executing wire bonding between a semiconductor chip (50) and an interposer (20), in which terminals (21) that connect to terminals (51) of the chip (50) and separate terminals (22) are formed, on the upper face of the interposer (20). A semiconductor chip (30) is mounted to the top face of a package substrate (10), the interposer (60) is adhered to the upper portion of the chip (30), and wire bonding is executed between the terminals (22) and terminals (11'). When configuring a semiconductor device with a plurality of semiconductor chips combined into one package in this manner, KGD (Known-Good-Die) can easily be guaranteed for each semiconductor chip, and semiconductor devices can be fabricated with a high yield of good units. Also, the semiconductor chips can be used as-is, without restricting the position, pitch, signal arrangement, or the like, of their terminals.

18 Claims, 9 Drawing Sheets

U.S. PATENT DOCUMENTS

| | | | |
|---|---|---|---|
| 7,282,794 | B2 | 10/2007 | Akram |
| 2007/0278648 | A1 | 12/2007 | Akram |
| 2009/0206462 | A1* | 8/2009 | Onodera .................. 257/686 |
| 2009/0243073 | A1* | 10/2009 | Carson et al. ............. 257/686 |
| 2009/0261460 | A1* | 10/2009 | Kuan et al. ............... 257/660 |
| 2009/0283889 | A1* | 11/2009 | Jang et al. ................ 257/686 |
| 2009/0309207 | A1* | 12/2009 | Chow et al. .............. 257/686 |

FOREIGN PATENT DOCUMENTS

| | | |
|---|---|---|
| JP | 02-139669 | 5/1990 |
| JP | 05-343608 | 12/1993 |
| JP | 08-070024 | 3/1996 |
| JP | 08-236693 | 9/1996 |
| JP | 09-330961 | 12/1997 |
| JP | 10-335574 | 12/1998 |
| JP | 11-204719 | 7/1999 |
| JP | 2001-196529 | 7/2001 |
| JP | 2002-040095 | 2/2002 |
| JP | 2002-083897 | 3/2002 |
| JP | 2002-141459 | 5/2002 |
| JP | 2003-249606 | 9/2003 |
| WO | 2004/034433 | 4/2004 |

OTHER PUBLICATIONS

International Search Report for corresponding Application No. PCT/JP03/16012 mailed Mar. 16, 2004.

"Part One: If a Chip Can Not be Used, There is a Package", Nikkei Electronics, Feb. 11, 2002, pp. 108-113, No. 815, Nikkei Business Publications, Inc., Chiyoda-ku, Tokyo, Japan.

"Lecture on basic microelectronics packaging technology (vol. 1) general statement, p. 26-28, Jul. 1, 1998, Society for Hybrid Microelectronics."

* cited by examiner

US 7,723,835 B2

SEMICONDUCTOR DEVICE PACKAGE STRUCTURE

CROSS-REFERENCE TO RELATED APPLICATIONS

This application is a continuation of U.S. Non-provisional application Ser. No. 10/595,424 filed Apr. 18, 2006 now abandoned, which is a §371 of PCT/JP2003/016012 filed on Dec. 15, 2003, the contents of which are hereby incorporated by reference.

TECHNICAL FIELD

The present invention relates to a semiconductor device package structure and packaging method.

BACKGROUND ART

In digital equipment using a semiconductor device such as a terminal apparatus in a movable communications system (portable telephone), it is usually important how highly the semiconductor is integrated in order to achieve smaller size and lighter weight of that equipment. With the miniaturization of semiconductor circuits progressing smoothly up to present, the merits of combining as many circuits as possible in a single chip, reducing packaging area, increasing speed, and reducing power consumption have been put to practical use. However, with the miniaturization of semiconductor circuits, the problems of a sudden rise in manufacturing costs and lengthening of the time for design and development came to light.

Accordingly, attention is being paid to SIP (System in Package) technology in which a plurality of semiconductor chips are implemented in three dimensions. As shown for example in FIG. 9, a semiconductor chip 30 is mounted on a package substrate 10, another semiconductor chip 40 is further mounted on this semiconductor chip 30, and wire bonding is executed with wire W between these semiconductor chips 30 and 40 and the package substrate 10. This technology is introduced in Nikkei Electronics 2002, 2-11 no. 815, p. 108, "Part One: If A Chip Can Not Be Used, There Is A Package".

However, with a conventional SIP, it is possible to house semiconductor chips made with varying processes in a single package so that reduction of the package area relative to the package substrate can be achieved. When a semiconductor device is configured by housing a plurality of semiconductor chips in one package in this manner, the yield of good units becomes an issue. That is, a wafer probe test is performed for each semiconductor chip in a wafer state, and only semiconductor chips that have been deemed good are mounted on a package substrate or the like.

However, there is the problem that when an assembly manufacturer who combines a plurality of semiconductor chips, for example, configures an SIP by performing wire bonding between the terminals (electrodes) of different semiconductor chips, the molding position of the terminals of both semiconductor chips, terminal pitch, signal line order, and the like need to be fixedly designed in advance, design freedom is reduced, and it is not possible to make good use of the characteristics of an SIP with which it is expected that development time can be shortened.

Also, a manufacturer who supplies semiconductor chips cannot perform all of the operation tests for semiconductor chips in a wafer state, e.g., reliability testing such as screening with high temperature continuous operation testing (burn-in) cannot be completely performed. Thus, semiconductor chips are individually judged to be good or not after being cut out from the wafer, and as a result, semiconductor chips for which KGD (Known-Good-Die: good chips that have been inspected) is guaranteed are obtained. However, in order to perform this sort of judgment for a chip in a state in which the chip has only been cut out from the wafer (a bare chip), an apparatus for electrically connecting to the terminals (electrodes) of each semiconductor chip or a special testing apparatus are individually necessary, and so there is the problem that cost increases.

Accordingly, it is an object of the present invention to provide a semiconductor package structure and packaging method in which, when combining a plurality of semiconductor chips, an electrical connection can easily be performed between the semiconductor chips without restricting the position, pitch, signal arrangement, and the like of external connection terminals for each semiconductor chip.

Also, it is another object of the present invention to provide a semiconductor package structure and packaging method in which a manufacturer who supplies semiconductor chips can easily guarantee KGD (Known-Good-Die) for semiconductor chips that configure an SIP, and in which an assembly manufacturer who fabricates SIPs can fabricate SIPs with a high yield of good units using KGD semiconductor chips.

DISCLOSURE OF INVENTION (1) In this invention, a semiconductor device package structure includes:

a semiconductor chip mounted interposer configured by mounting a semiconductor chip to an interposer in which inside terminals to which terminals of a semiconductor chip to be mounted are connected, outside terminals to which terminals other than the terminals of the semiconductor chip are connected, and conductive wiring that makes an electrical connection between the outside terminals and the inside terminals are formed, and a substrate-like or frame-like base material on which a plurality of semiconductor chips are mounted, wherein the semiconductor chip mounted interposer is mounted along with another semiconductor chip to the base material, and the semiconductor chip mounted interposer and the other semiconductor chip are resin sealed along with the base material.

(2) Also, in this invention, in (1) the semiconductor chip mounted interposer is mounted on a semiconductor chip that is mounted to the base material.

(3) Also, in this invention, in (1) a plurality of the semiconductor chip mounted interposer are provided, and those semiconductor chip mounted interposers are disposed laminated on the base material.

(4) Also, in this invention, in (1) the semiconductor chip mounted interposer is configured by mounting semiconductor chips to both faces of the interposer, sandwiching the interposer.

(5) Also, in this invention, in (1) the semiconductor chip mounted interposer is configured by disposing a plurality of semiconductor chips laminated on the interposer.

(6) Also, in this invention, in (1) the semiconductor chip mounted interposer is configured by resin sealing the semiconductor chip mounted on the interposer along with the interposer, separate from resin sealing to the base material.

(7) Also, in this invention, in (1), the interposer, in a state before being mounted to the base material, is provided with terminals for connecting to a testing apparatus in order to perform predetermined reliability testing or operation testing, and the semiconductor chip mounted interposer, in a state before being mounted to the base material, is obtained by removing the terminals after the predetermined reliability testing or operation testing using the terminals has been performed.

(8) Also, in this invention, a semiconductor chip mounted interposer is configured by mounting a semiconductor chip to an interposer in which inside terminals to which terminals of a semiconductor chip to be mounted are connected, outside terminals to which terminals other than the terminals of the semiconductor chip are connected, and conductive wiring that makes an electrical connection between the outside terminals and the inside terminals, are formed; the semiconductor chip mounted interposer is mounted to a substrate-like or frame-like base material; and the semiconductor chip mounted interposer is resin sealed together along with the base material.

(9) Also, in this invention, in (8), in a state before mounting to the base material, terminals for connecting a testing apparatus are provided in the interposer, predetermined reliability testing or operation testing is performed by connecting the testing apparatus to the terminals, and after performing the reliability testing or operation testing the terminals are detached and the semiconductor chip mounted interposer is configured, and the semiconductor chip mounted interposer is mounted to the base material.

BEST MODE FOR CARRYING OUT THE INVENTION

Figure 1:
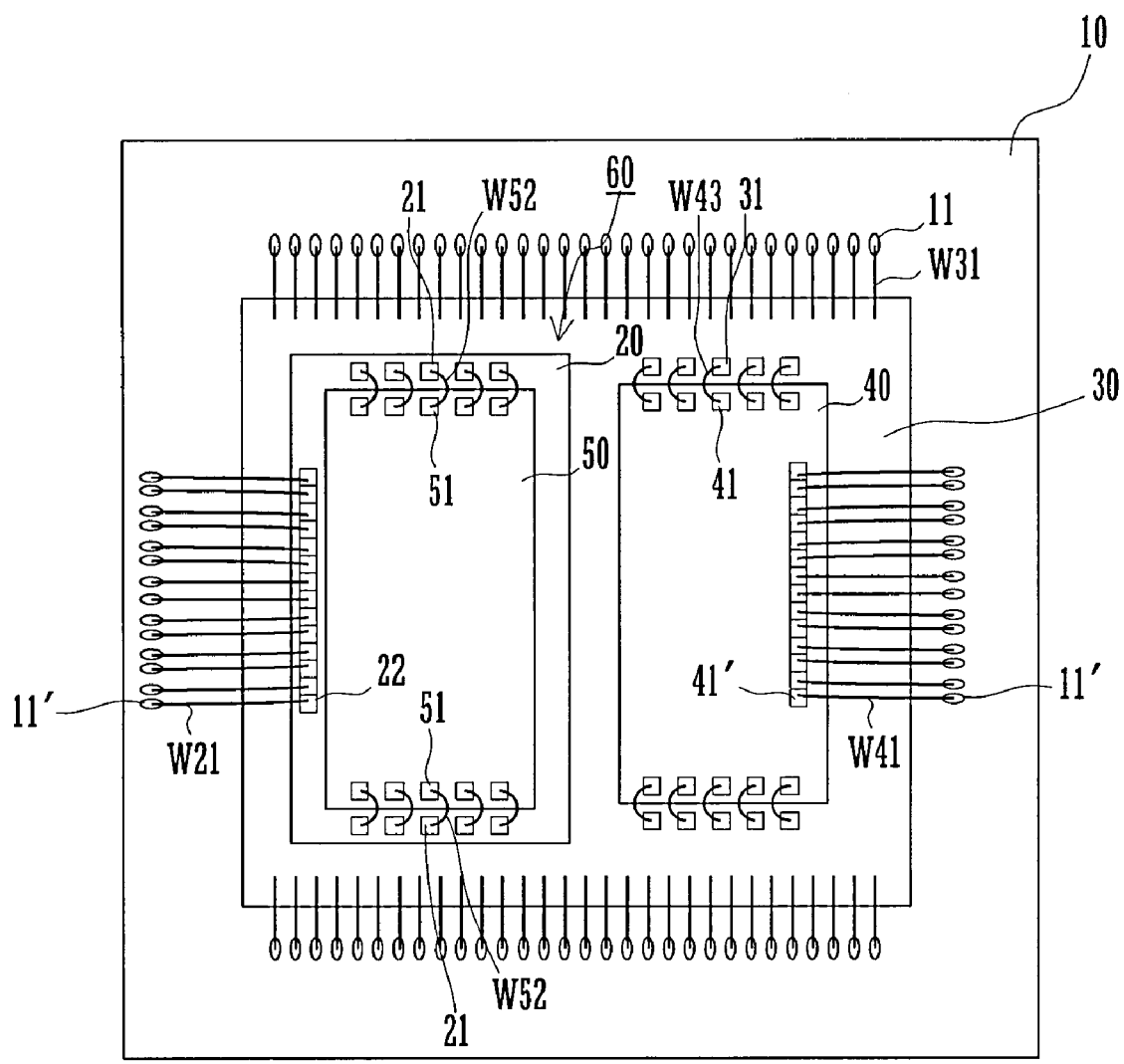
FIG. 1 is plan view that shows the package structure of a semiconductor device according to a first embodiment.
Figure 2:
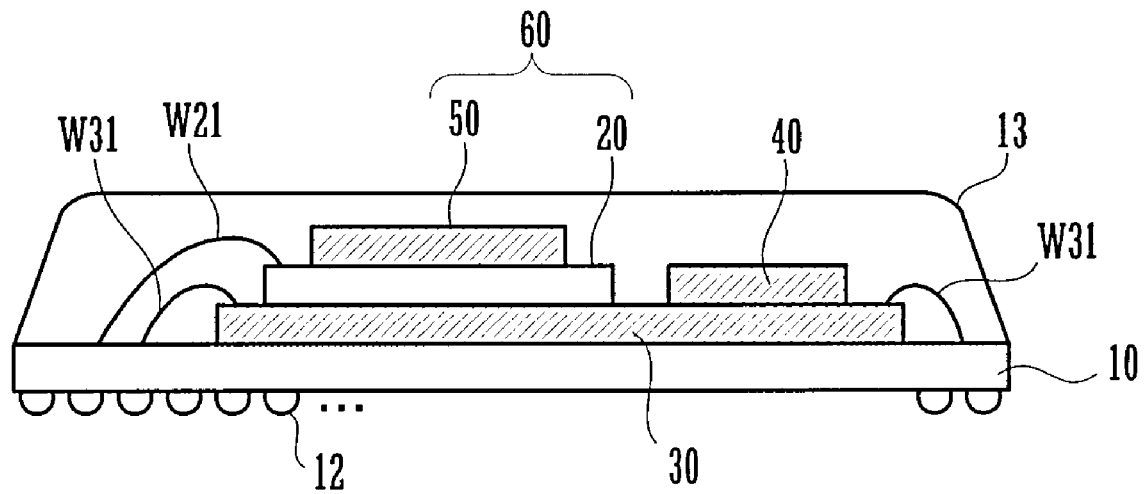
FIG. 2 is a cross-sectional view of the main portions of the semiconductor device according to the first embodiment.

The semiconductor device package structure and packaging method, which is a first embodiment, are described based on FIGS. 1 and 2.

FIG. 1 is a plan view of the semiconductor device, and FIG. 2 is a cross-sectional view of its main portions. In FIGS. 1 and 2, a semiconductor chip 30 is die-bonded on the upper face of a package substrate 10. A semiconductor chip 50 is mounted to an interposer 20. A semiconductor chip mounted interposer 60 is configured by the interposer 20 and the semiconductor chip 50. The semiconductor chip mounted interposer 60 is mounted by adhering its lower face (the lower face of the interposer 20) to the semiconductor chip 30. Separately, the semiconductor chip 40 is mounted to the top of the semiconductor chip 30.

A plurality of terminals 11 and 11' are formed arranged on the upper face of the package substrate 10. A plurality of soldering balls 12 are formed arranged on the lower face of the package substrate 10. Between the terminals 11 and 11' on the upper face and the soldering balls 12 on the lower face of the package substrate 10, electricity is conducted via a wiring layer inside the package substrate 10.

Between terminals arranged on the periphery of the upper face of the semiconductor chip 30 and the terminals 11 arranged on the upper face of the package substrate 10, wire bonding is executed by wires W31. Terminals 51 are formed on the upper face of the semiconductor chip 50. Terminals 21 that correspond to "inside terminals" according to this invention are formed on the upper face of the interposer 20, and wire bonding is executed between the terminals 21 and 51 with wires W52.

Terminals 22 that correspond to "outside terminals" according to this invention are formed on the upper face of the interposer 20. Between these terminals 22 and the terminals 21, electricity is conducted via a wiring layer inside the interposer 20. Between the terminals 22 of the interposer 20 and the terminals 11' of the package substrate 10, wire bonding is executed with wires W21. By changing the positions of terminals on the interposer 20 in this manner, an electrical connection can be easily made with the semiconductor chips that are already present in their current state, without altering the position, pitch, signal arrangement, and the like of external connection terminals (pads) of the semiconductor chips.

Also, in this manner the semiconductor chip mounted interposer 60 is treated like a KGD semiconductor chip, so that it can be mounted on a package substrate together with other semiconductor chips.

In this example, the semiconductor chip 40 is already designed such that it can be used as an SIP along with the semiconductor chip 30, and so the semiconductor chip 40 does not use an interposer. Wire bonding is executed with wires W43 between terminals 41 on the upper face of the semiconductor chip 40 and terminals 31 formed on the upper face of the semiconductor chip 30. Further, wire bonding is executed with wires W41 between predetermined terminals 41' of the semiconductor chip 40 and terminals 11' on the package substrate.

The example in FIG. 1 shows a state before resin sealing is performed in a portion above the package substrate 10. As shown in FIG. 2, the semiconductor chips 30 and 40, the semiconductor chip mounted interposer 60 and the wires that connect them are all resin sealed on the upper face of the package substrate 10 with a sealing resin 13.

Here, the semiconductor chip 30 is another semiconductor chip, whose size is, for example, 8.5 mm by 8.5 mm. The semiconductor chip 40 is another semiconductor chip. The semiconductor chip 50 on the interposer 20 is, for example, 32M by 32 bit DRAM, whose size is, for example, 3.0 mm by 5.7 mm. The terminals 51 are arranged on the short side of the semiconductor chip 50, and so the terminals 21 of the interposer 20 are arranged along the short side of the semiconductor chip 50. Thus, the wire length of the wires W52 can be short. Also, the terminals 22 are formed arranged at predetermined positions on the interposer 20 along one of the long sides of the semiconductor chip 50 near the terminals 11' on the package substrate 10. By positioning the interposer 20 near the terminals 11' on the package substrate 10, the wire length of the wires W21 can be short.

Figure 3:
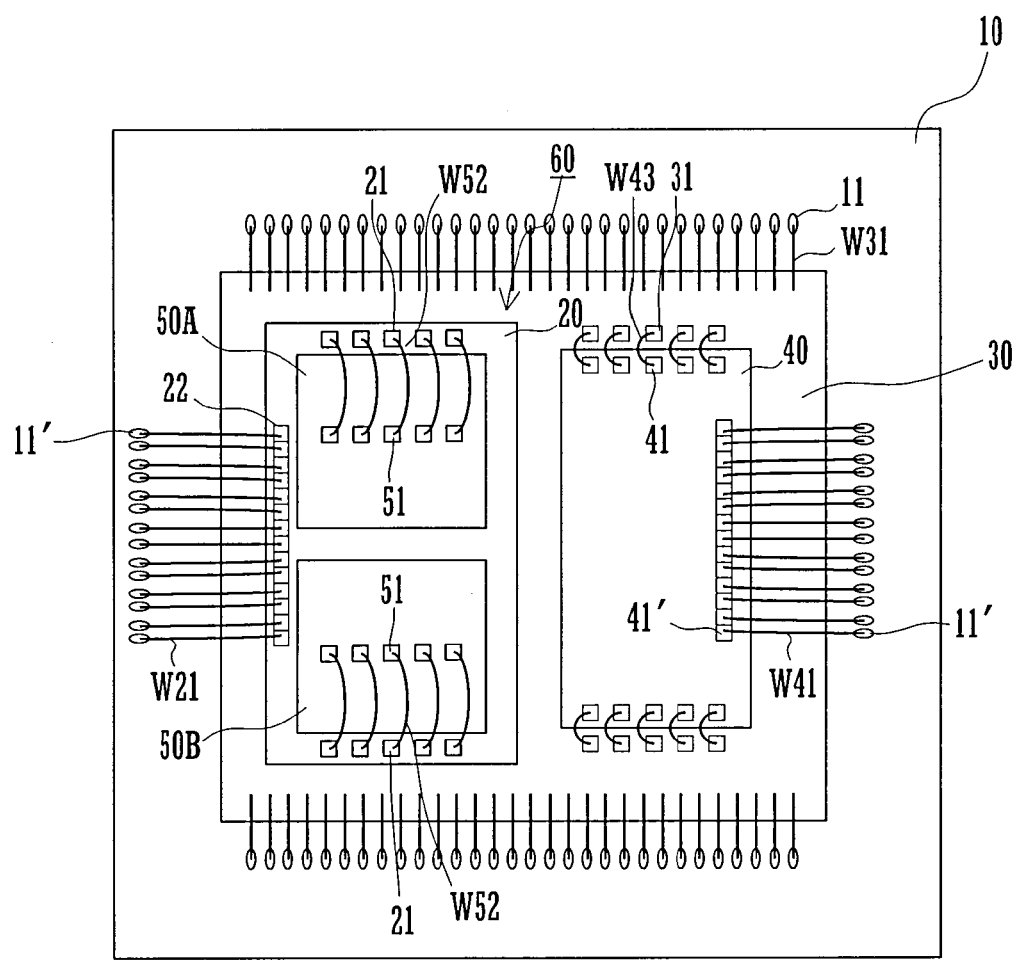
FIG. 3 is a plan view that shows the structure of a semiconductor device according to a second embodiment.

FIG. 3 is a plan view of a semiconductor device according to a second embodiment. The structure of the semiconductor chip mounted interposer 60 differs from the example shown in FIG. 1. In the example shown in FIG. 3, two semiconductor chips 50A and 50B are mounted on the interposer 20. These are each 16 M by 16 bit DRAM, and the terminals 51 are formed in the center of each semiconductor chip. Even when a plurality of semiconductor chips are used in this manner, by mounting them on a single interposer 20, the semiconductor chip mounted interposer 60 can be treated as though it is a 32 M by 16 bit or 16 M by 32 bit DRAM.

Also, even when using semiconductor chips in which terminals are arranged in the center, by disposing the terminals 21 at positions on the interposer 20 closest to the terminals of each semiconductor chip, the wire length of the wires W52 between the terminals 51 of each semiconductor chip 50A and 50B and the terminals 21 on the interposer 20 can be short.

Figure 4:
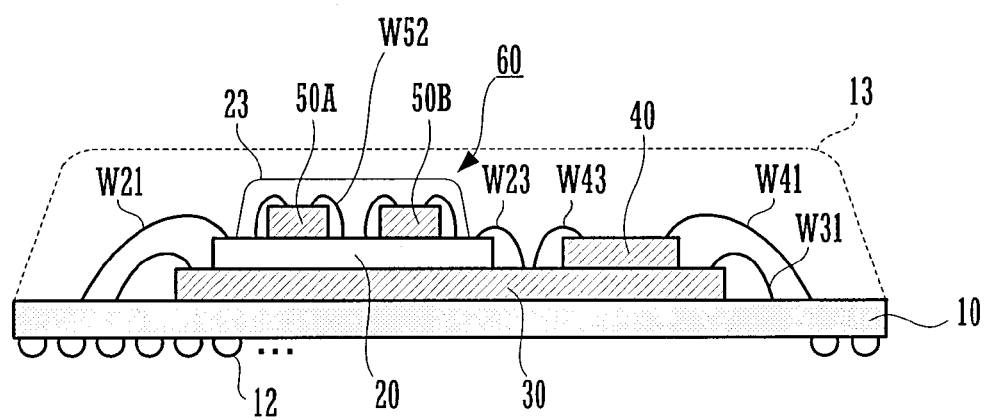
FIG. 4 is a cross-sectional view that shows the structure of semiconductor device according to a third embodiment.

FIG. 4 is a cross-sectional view of the main portions of a semiconductor device according to a third embodiment. The semiconductor chip mounted interposer 60 is configured by mounting the two semiconductor chips 50A and 50B on the upper face of the interposer 20 and executing wire bonding. Wiring that makes an electrical connection between the semiconductor chips 50A and 50B is provided in the interposer 20. The semiconductor chip 30 is bonded to the upper portion of the package substrate 10, and the semiconductor chip mounted interposer 60 is mounted on the upper face of the semiconductor chip 30. The other semiconductor chip 40 is also mounted.

Unlike the examples shown in FIGS. 1 to 3, in this example the periphery of the semiconductor chips 50A and 50B on the upper portion of the interposer 20 is resin sealed with a sealing resin 23. By adopting a configuration in which the semiconductor chips are resin sealed in a state as the semiconductor chip mounted interposer 60, handling is easy when adhering the semiconductor chip mounted interposer 60 to the semiconductor chip 30. Also, it is easy to transport in a state as the semiconductor chip mounted interposer 60 with the surroundings of the periphery of the semiconductor chips 50A and 50B kept clean. The sealing resin 23 is ultimately covered by the sealing resin 13 above the package substrate 10, and not exposed to the outside of the semiconductor device, so mechanical strength like that of the sealing resin 13 is not necessary, and it is preferable to use a simple method for resin sealing. For example, resin sealing is performed by a method of potting liquid resin, not by a method such as transfer molding.

In the example shown in FIG. 4, wire bonding is executed with wires W23 between the terminals provided on the upper face of the interposer 20 of the semiconductor chip mounted interposer 60 and the terminals provided on the top face of the semiconductor chip 30. In this way, it is possible to make an electrical connection between the semiconductor chips of the semiconductor chip mounted interposer 60 and a separate semiconductor chip without going through the package substrate 10.

Figure 5:
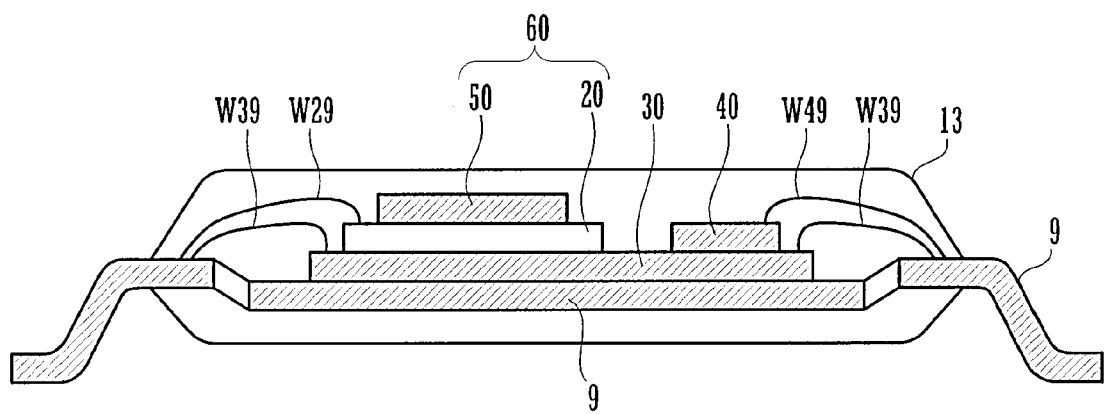
FIG. 5 is a cross-sectional view that shows the structure of semiconductor device according to a fourth embodiment.

FIG. 5 is a cross-sectional view of the main portion of a semiconductor device according to a fourth embodiment. In the first to fourth embodiments, packaging was performed using the package substrate as the base material, but in the example shown in FIG. 5, a plurality of semiconductor chips are packaged using a lead frame 9 as the base material. The semiconductor chip 30 is die-bonded in the center portion of the lead frame 9. The semiconductor chip mounted interposer 60, configured from the semiconductor 50 and the interposer 20, and the simple semiconductor chip 40 are each mounted to the upper portion of the semiconductor chip 30. Wire bonding is executed with wires W39 between the semiconductor chip 30 and the inner lead portion of the lead frame 9. Wire bonding is executed with wires W49 between the semiconductor chip 40 and the inner lead of the lead frame 9. Wire bonding is executed with wires W29 between the terminals of the interposer 20 and the inner lead of the lead frame 9. The plurality of semiconductor chips portion and the wire portion are resin sealed with the sealing resin 13. In this way, a semiconductor with lead terminals, in which the outer leads of the lead frame 9 protrude outside of the sealing resin 13, can be configured.

Figure 6:
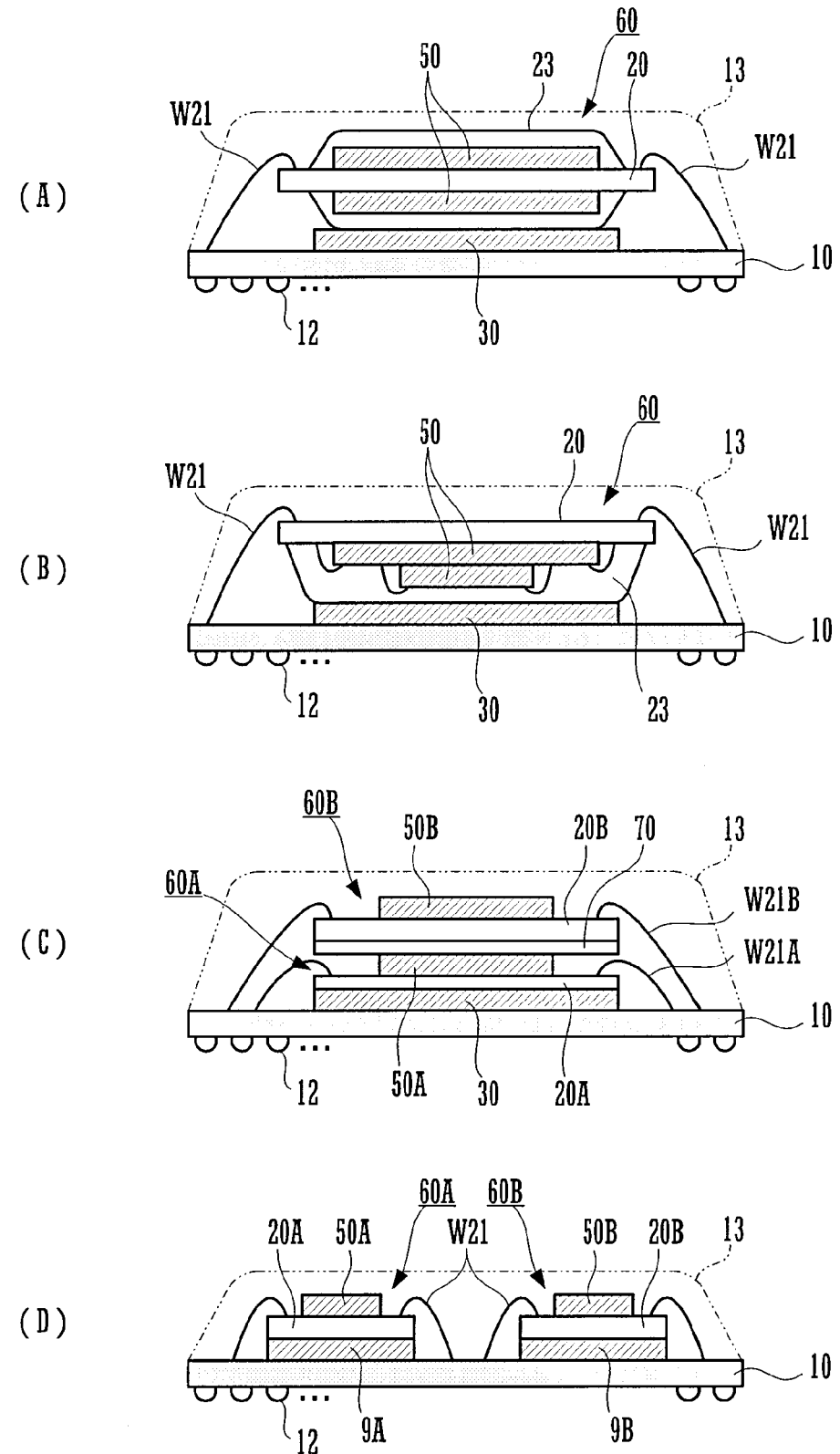
FIG. 6 is a cross-sectional view that shows the structure of four semiconductor devices according to a fifth embodiment.

FIG. 6 shows the package structure and packaging method of terminal apparatuses according to a fifth embodiment. Each terminal apparatus is shown in a cross-sectional view of their main portions. In the example shown in (A), the semiconductor chip 50 is flip-chip bonded to each of both faces of the interposer 20. The periphery of the semiconductor chips 50 is resin sealed with the sealing resin 23, configuring the semiconductor chip mounted interposer 60. The semiconductor chip 30 is flip-chip bonded to the upper face of the package substrate 10. The semiconductor chip mounted interposer 60 is adhered to the upper portion of the semiconductor chip 30, and wire bonding is executed with the wires W21 between the terminals formed on the upper face of the interposer 20 and the terminals formed on the upper face of the package substrate 10. The soldering balls 12 are formed arranged on the lower face of the package substrate 10. The entire body including the semiconductor chips 30 and the semiconductor chip mounted interposer 60 is resin sealed above the package substrate 10 with the sealing resin 13. FIG. 6 shows only the outer shape of the sealing resin 13.

In example (B) in FIG. 6, two of the semiconductor chips 50 are disposed laminated in the interposer 20. In this example, wire bonding is executed between the semiconductor chips 50 and the interposer 20. The periphery of the semiconductor chips 50 is resin sealed with the sealing resin 23. The semiconductor chip 30 is flip-chip bonded to the upper face of the package substrate 10, the semiconductor chip mounted interposer 60 is adhered to the upper portion of the semiconductor chip 30, and wire bonding is executed with the wires W21 between the interposer 20 and the package substrate 10. The configuration of the other portions in example (B) is the same as in the case of example (A). The semiconductor chips 50 may also be flip-chip bonded to the interposer 20. Also, another semiconductor chip may be flip-chip bonded on a semiconductor chip.

In example (C) in FIG. 6, a first semiconductor chip mounted interposer 60A, formed by flip-chip bonding a semiconductor chip 50A to an interposer 20A, and a semiconductor chip mounted interposer 60B, formed by flip-chip bonding a semiconductor chip 50B to an interposer 20 B, are provided. Also, a semiconductor chip 30 is flip-chip bonded to the upper face of the package substrate 10.

When fabricating this semiconductor device, first the semiconductor chip 30 is flip-chip bonded to the package substrate 10, the first semiconductor chip mounted interposer 60A is adhered to the upper face of the semiconductor chip 30, and the wire bonding is executed with wires W21A between the respective terminals of the upper face of the interposer 20A and the package substrate 10. Next an adhesive sheet 70 is placed on the upper face of the semiconductor chip mounted interposer 60A (the upper face of the semiconductor chip 50A) and the second semiconductor chip mounted interposer 60B is adhered fixed to the first semiconductor chip mounted interposer 60A. The adhesive sheet 70 may also be provided in advance on the lower face of the interposer 20B of the second semiconductor chip mounted interposer 60B. In this state, wire bonding is executed with wires W21B between the terminals on the upper face of the interposer 20B and the terminals on the upper face of the package substrate 10.

Afterwards, resin sealing is performed in a portion above the package substrate 10 with the sealing resin 13. By disposing a plurality of laminated semiconductor chip mounted interposers 60 in this manner, it is possible to configure a semiconductor device provided with many semiconductor chips without increasing the occupied area when implemented in a package substrate.

In example (D) in FIG. 6, the two semiconductor chip mounted interposers 60A and 60B are arranged horizontally relative to the package substrate 10. The semiconductor chip mounted interposers 60A and 60B are configured by flip-chip mounting the semiconductor chips 50A and 50B to the upper face of the interposers 20A and 20B, respectively. Semiconductor chips 9A and 9B are each flip-chip mounted to the upper face of the package substrate 10. The semiconductor chip mounted interposers 60A and 60B are adhered to the upper face of the semiconductor chips 9A and 9B. Wire bonding is executed with the wires W21 between the terminals on the upper face of the interposers 20A and 20B and the terminals of the package substrate 10. The configuration of the other portions in example (D) is the same as in the case of examples (A) to (C). By horizontally arranging a plurality of the semiconductor chip mounted interposers 60 in this manner, a semiconductor device is obtained in which many semiconductor chips are provided in the package without increasing the thickness of the package.

In all of the examples given above, the interposer 20 and the package substrate 10 were connected with wire, but a configuration may also be adopted in which outside terminals are arranged on the periphery of the interposer, and are joined both electrically and mechanically to terminals on the package substrate by pressing against them. A configuration may also be adopted in which soldering bumps are formed as outside terminals on the joining face of the interposer (the face facing the package substrate and the like), and the soldering bumps are joined to terminals on the package substrate or terminals on the semiconductor chip on which the package substrate is mounted.

Next, a method for converting a semiconductor chip mounted interposer to a KGD is described with reference to FIGS. 7 and 8.

Figure 7:
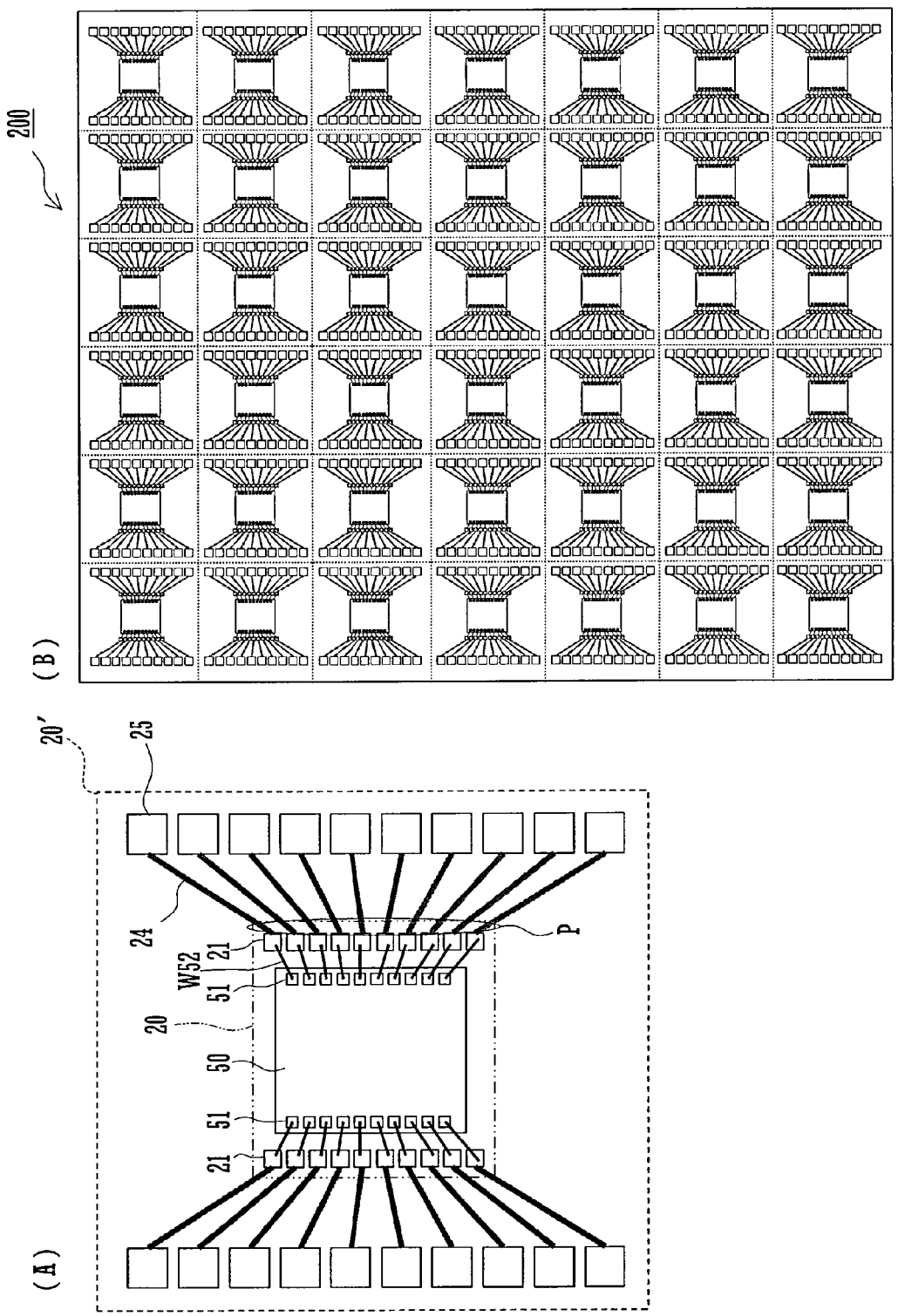
FIG. 7 shows a semiconductor chip mounted interposer testing method used for a semiconductor device according to a sixth embodiment.

(B) in FIG. 7 shows a "pre-detachment interposer" 200, in a state in which reliability and operation testing for a plurality of semiconductor chip mounted interposers is performed. (A) shows an enlarged view of a test interposer unit 20' when testing is performed, which is one unit of the pre-detachment interposer 200. The semiconductor chip 50 is mounted to the test interposer unit 20', and wire bonding is executed with the wires W52 between the terminals 51 of the semiconductor chip 50 and the terminals 21 of the interposer. Testing terminals 25 are formed on the interposer with a larger pitch than the arranged pitch of the terminals 21, and the testing terminals 25 and the terminals 21 are joined by wiring 24. The area shown by the double-dotted broken line in FIG. 2 is the region that becomes an interposer 20 after detachment, and after detaching this region it is used as a semiconductor chip mounted interposer. The outside terminals (the terminals corresponding to the terminals 22 in FIG. 1) are omitted in FIG. 7.

In the state of the pre-detachment interposer 200 shown in (B) in FIG. 7, a testing apparatus is connected to each testing terminal 25, and various reliability and operation testing is performed. For example, screening such as the high-temperature continuous operation testing (burn-in) described above is performed. Then, good units of semiconductor chip mounted interposers configured from a semiconductor chip 50 and an interposer 20 are selected.

After detaching the interposer region 20, a portion of the wiring 24 that extends from the terminals 21 to the testing terminals 25 (the portion of the wiring 24 shown by P in FIG. 7), remains in the interposer 20. However, in the figures referred to in embodiments 1 to 5, the portion of the wiring 24 that remains in the interposer 20 is not shown for the sake of clarity of the figures.

Figure 8:
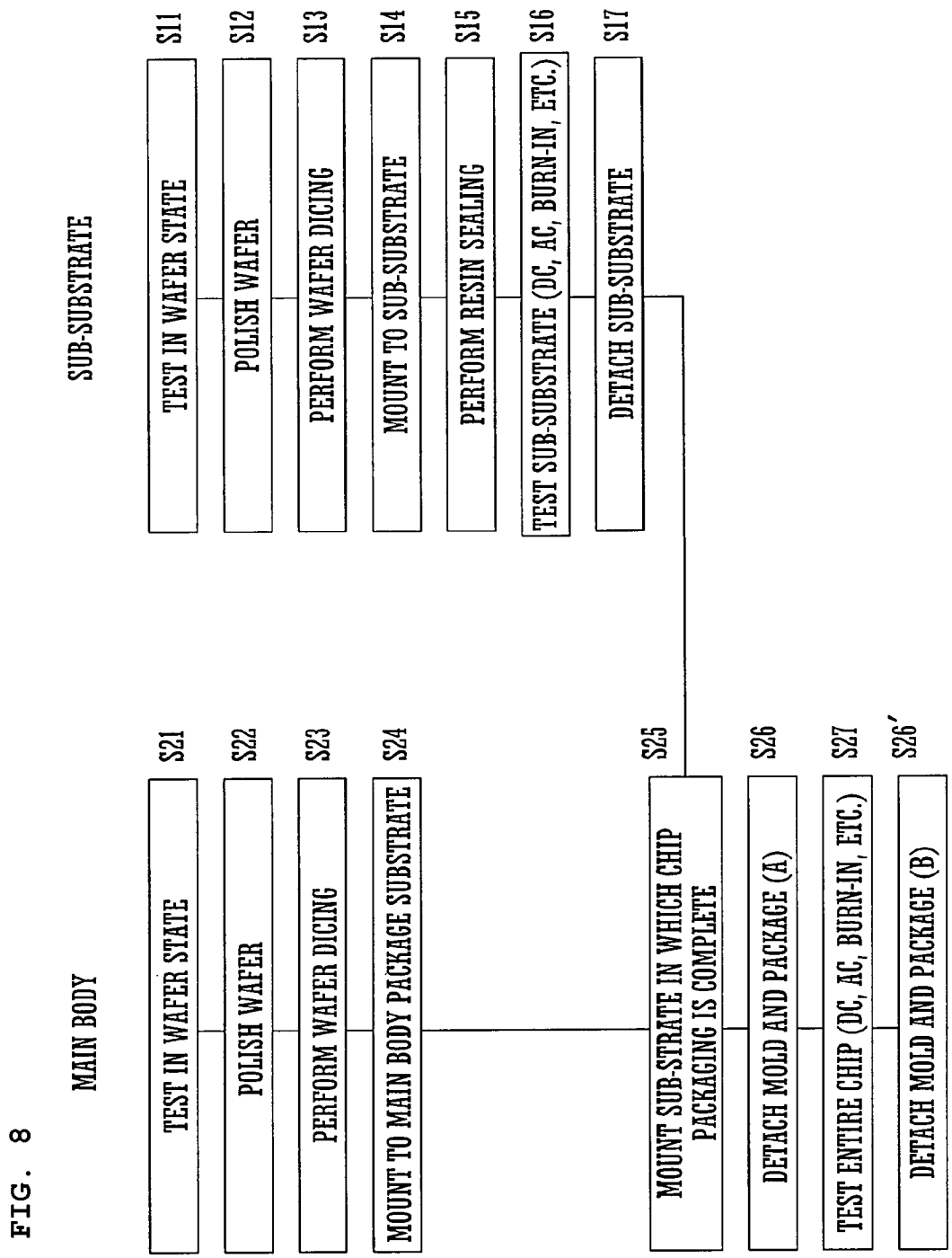
FIG. 8 is a flowchart that shows the assembly process of an entire semiconductor device including an interposer test for the semiconductor device according to the sixth embodiment.
Figure 9:
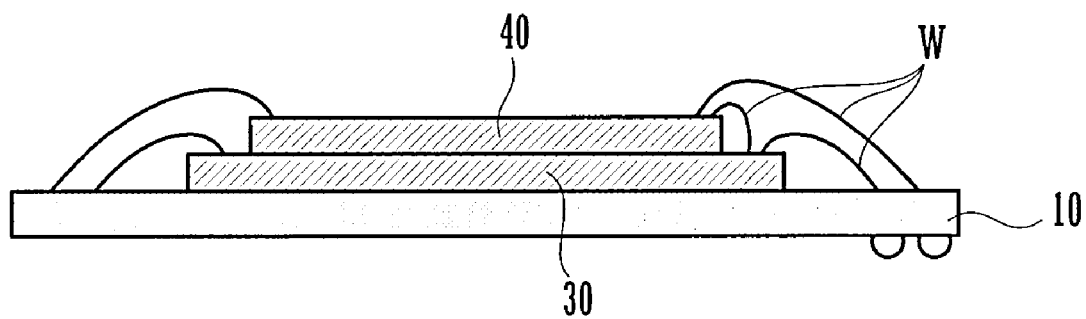
FIG. 9 is a cross-sectional view that shows the configuration of a conventional semiconductor device.

FIG. 8 is a flowchart that shows the assembly process of an entire semiconductor device including the above interposer test. First, an interposer is tested with a semiconductor chip that will be mounted to the interposer in a wafer state (S11). Afterwards, the back face of the wafer is polished and thinned to a predetermined thickness (S12), and separated into individual semiconductor chips 50 by wafer dicing (S13). Of these semiconductor chips 50, those deemed to be good are mounted on an interposer 20 (S14). Next, the semiconductor chip portion is resin sealed as necessary (S15). Afterward, the reliability and operation testing described above is performed, and the respective semiconductor chips are judged to be good or not (S16). Thereafter, each interposer 20 region is detached (S17).

On the other hand, with respect to the main body portion, first testing is performed with a semiconductor chip that will be mounted to the package substrate 10 in a wafer state (S21). Afterwards, wafer polishing and dicing are performed (S22 and S23), and each semiconductor chip 30 is mounted on a package substrate 10 (S24). Afterwards, the semiconductor chip mounted interposer 60, which is KGD, is mounted (S25). Next the portion above the package substrate 10 is resin sealed, and detached into individual package substrates (S26). Then various reliability and operation testing as performed for the interposers described above is performed for each semiconductor device (S27). In this manner good semiconductor device units are obtained. A configuration may also be adopted in which instead of performing above Step S26, testing is performed for a plurality of semiconductor devices before detaching the package substrate, afterward resin sealing is performed, and then detachment as package substrates (S26').

Examples were described in which various connections were made between semiconductor chips, between a package substrate and interposer, between a semiconductor chip and package substrate, and between a semiconductor chip and interposer by wire bonding or a flip-chip connection, but a configuration may also be adopted in which all or a part of these portions are connected using a wiring sheet or the like in which wiring is executed on a flexible sheet. That is, a configuration may be adopted in which a plurality of wires are formed in sheets, both ends of which are made terminals, and those terminals are connected to counterpart terminals with which they should be connected. For example, when making a connection between an interposer and a package substrate, the terminals on one side of a wiring sheet may be connected to the terminals of the interposer, and the terminals on the other side of the wiring sheet connected to the terminals of the package substrate.

According to this invention, a semiconductor chip mounted interposer configured by mounting a semiconductor chip to an interposer in which inside terminals to which the terminals of a semiconductor chip to be mounted are connected, outside terminals to which terminals other than the terminals of the semiconductor chip are connected, and conductor wiring that makes an electrical connection between the outside terminals and the inside terminals are formed, is provided, and the semiconductor chip mounted interposer is mounted along with another semiconductor chip to the base material, and so this semiconductor chip mounted interposer can be used as one of a plurality of semiconductor chips that configure a conventional SIP, for example. When doing so, because the semiconductor chips have been mounted to the interposer, signal reliability and operation testing can be performed in the state as the semiconductor chip mounted interposer, and this semiconductor chip mounted interposer can be treated as a device the same as a semiconductor chip for which FGD is guaranteed. Also, when making an electrical connection between semiconductor chips, because a connection is made between the terminals of a semiconductor chip in the lower portion and the terminals of the semiconductor chip mounted interposer in the upper portion, it is possible to design the terminals of individual semiconductor chips separately. Also, a semiconductor chip that has already been designed and fabricated can be used as-is. As a result, lower cost can be achieved.

According to this invention, the entire semiconductor device can be made thinner due to mounting the semiconductor chip mounted interposer on a semiconductor chip on the base material.

Also, according to this invention, by providing a plurality of semiconductor chip mounted interposers, and disposing those semiconductor chip mounted interposers laminated on the base material, a structure in which more semiconductor chips are disposed laminated can be easily configured.

Also, according to this invention, due to a semiconductor chip being mounted on both faces of the semiconductor chip mounted interposer, many semiconductor chips can be packaged without increasing the mounting area of the semiconductor chip mounted interposer relative to the base material.

Also, according to this invention, by configuring the semiconductor chip mounted interposer with a plurality of semiconductor chips disposed laminated on the interposer, it is possible to package more semiconductor chips in a single package without increasing the mounting area of the semiconductor chip mounted interposer relative to the base material.

Also, according to this invention, due to resin coating the interposer along with the semiconductor chips mounted on the interposer, separate from resin sealing the semiconductor chip mounted interposer to the base material, handling in the state of the semiconductor chip mounted interposer is easy, and the reliability of the semiconductor chip mounted interposer can be easily insured.

Also, according to this invention, in the state of the interposer before it is mounted to the base material, terminals for connecting to a testing apparatus in order to perform predetermined reliability testing or operation testing are provided, and by detaching the terminals from the semiconductor chip mounted interposer after predetermined reliability and operation testing is performed using the terminals in a state before the semiconductor chip mounted interposer is mounted to the base material, it is possible to treat the semiconductor chip mounted interposer as a device that is the same as a semiconductor chip for which KGD is guaranteed.

The invention claimed is:

1. A semiconductor device package structure comprising:
    a package substrate having a first surface and a second surface;
    a plurality of first terminals formed on the first surface of the package substrate;
    a plurality of soldering balls formed on the second surface of the package substrate, each of the plurality of soldering balls electrically connected to corresponding one of the plurality of first terminals;
    a first semiconductor chip arranged over the first surface of the package substrate;
    a semiconductor-chip-mounted-interposer arranged over the first semiconductor chip, the semiconductor-chip-mounted-interposer including:
       (i) an interposer arranged in parallel to the package substrate, the interposer having a third surface facing the first surface and a fourth surface facing away from the first surface,
       (ii) a plurality of second terminals formed on the fourth surface of the interposer,
       (iii) a second semiconductor chip arranged over the third surface of the interposer, the second semiconductor chip electrically connected to the interposer, and
       (iv) a first sealing resin for sealing a part of the interposer and the second semiconductor chip;
    a plurality of wires for electrically connecting the first terminals formed on the first surface of the package substrate and the second terminals formed on the fourth surface of the interposer; and
    a second sealing resin for sealing a part of the package substrate, the first semiconductor chip, the semiconductor-chip-mounted-interposer and the plurality of wires.

2. The semiconductor device package structure according to claim 1 wherein the semiconductor-chip-mounted-interposer further includes a third semiconductor chip formed over the second semiconductor chip, and wherein the second semiconductor chip and the third semiconductor chip are integrally sealed by the first sealing resin.

3. The semiconductor device package structure according to claim 1 wherein the second semiconductor chip has a plurality of third terminals, and the plurality of third terminals are wire bonded to the interposer.

4. The semiconductor device package structure according to claim 3 wherein the plurality of third terminals are arranged in a periphery of the second semiconductor chip.

5. The semiconductor device package structure according to claim 1 wherein the semiconductor-chip-mounted-interposer is adhered to a surface of the first semiconductor chip.

6. The semiconductor device package structure according to claim 1 wherein the first semiconductor chip is flip-chip bonded to the first surface of the package substrate.

7. The semiconductor device package structure according to claim 1 wherein the second semiconductor chip is a Known Good Die.

8. The semiconductor device package structure according to claim 1 wherein the second semiconductor chip is a DRAM 9. The semiconductor device package structure according to claim 1 wherein the plurality of wires are bonding wires.

10. The semiconductor device package structure according to claim 1 wherein the plurality of wires are formed on a flexible sheet.

11. A semiconductor device package structure comprising:
    a package substrate having a first surface and a second surface;
    a plurality of soldering balls formed on the second surface of the package substrate;
    a first semiconductor chip arranged over the first surface of the package substrate;
    a semiconductor-chip-mounted-interposer arranged over the first semiconductor chip, the semiconductor-chip-mounted-interposer including:
       (i) an interposer arranged in parallel to the package substrate, the interposer having a third surface facing the first surface and a fourth surface facing away from the first surface,
       (ii) a second semiconductor chip arranged over the third surface of the interposer, the second semiconductor chip electrically connected to the interposer, and (iii) a first sealing resin for sealing a part of the interposer and the second semiconductor chip;

a plurality of wires for electrically connecting the semiconductor-chip-mounted-interposer and the package substrate; and a second sealing resin for sealing a part of the package substrate, the first semiconductor chip, the semiconductor-chip-mounted-interposer and the plurality of wires.

12. The semiconductor device package structure according to claim 11 wherein the semiconductor-chip-mounted-interposer further includes a third semiconductor chip formed over the second semiconductor chip, and wherein the second semiconductor chip and the third semiconductor chip are integrally sealed by the first sealing resin.

13. The semiconductor device package structure according to claim 11 wherein the semiconductor-chip-mounted-interposer is adhered to a surface of the first semiconductor chip.

14. The semiconductor device package structure according to claim 11 wherein the first semiconductor chip is flip-chip bonded to the first surface of the package substrate.

15. The semiconductor device package structure according to claim 11 wherein the second semiconductor chip is a Known Good Die.

16. The semiconductor device package structure according to claim 11 wherein the second semiconductor chip is a DRAM 17. The semiconductor device package structure according to claim 11 wherein the plurality of wires are bonding wires.

18. The semiconductor device package structure according to claim 11 wherein the plurality of wires are formed on a flexible sheet.

* * * * *